United States Patent
Ikushima

(10) Patent No.: US 11,453,076 B2
(45) Date of Patent: Sep. 27, 2022

(54) LASER SOLDERING METHOD AND DEVICE

(71) Applicant: MUSASHI ENGINEERING, INC., Mitaka (JP)

(72) Inventor: Kazumasa Ikushima, Tokyo (JP)

(73) Assignee: MUSASHI ENGINEERING, INC., Mitaka (JP)

( * ) Notice: Subject to any disclaimer, the term of this patent is extended or adjusted under 35 U.S.C. 154(b) by 519 days.

(21) Appl. No.: 16/607,922

(22) PCT Filed: Apr. 24, 2018

(86) PCT No.: PCT/JP2018/016599
§ 371 (c)(1),
(2) Date: Oct. 24, 2019

(87) PCT Pub. No.: WO2018/199086
PCT Pub. Date: Nov. 1, 2018

(65) Prior Publication Data
US 2020/0094336 A1 Mar. 26, 2020

(30) Foreign Application Priority Data
Apr. 28, 2017 (JP) .............................. JP2017-090417

(51) Int. Cl.
*H05K 3/34* (2006.01)
*B23K 1/005* (2006.01)
*G06F 30/367* (2020.01)

(52) U.S. Cl.
CPC .......... *B23K 1/0056* (2013.01); *G06F 30/367* (2020.01); *H05K 3/34* (2013.01); *H05K 2203/107* (2013.01)

(58) Field of Classification Search
CPC .. H05K 3/34; H05K 2203/107; H05K 3/3485; H05K 3/3494; G05F 30/367;
(Continued)

(56) References Cited

U.S. PATENT DOCUMENTS 6,278,078 B1 * 8/2001 Walvoord ............ H05K 3/3494
219/121.61
8,525,072 B2 * 9/2013 Nakai .................. B23K 1/0056
219/121.65
(Continued)

FOREIGN PATENT DOCUMENTS

JP S59-150665 A 8/1984
JP S60-180666 A 9/1985
(Continued)

OTHER PUBLICATIONS

Translation of International Search Report dated Jul. 24, 2018, issued in counterpart Application No. PCT/JP2018/016599. (1 page).
(Continued)

*Primary Examiner* — Donghai D Nguyen
(74) *Attorney, Agent, or Firm* — WHDA, LLP

(57) ABSTRACT

A laser soldering technique prevents generation of scorching of a substrate or heat-susceptible components in the surroundings, residues, etc. A method includes adjusting a height of the laser soldering device 1 to a position at which laser light has a preset irradiation diameter D1 larger than a diameter of a solder droplet S, irradiating the solder droplet S with the laser light to heat the solder droplet S to a temperature at which a flux solvent component volatilizes and a solder powder does not melt; adjusting the height of the laser soldering device to a position at which the laser light has a preset irradiation diameter D2 smaller than the diameter of the solder droplet S, and irradiating the solder droplet S with the laser light to heat the solder droplet S to a temperature at which the solder powder melts, and performing soldering.

21 Claims, 11 Drawing Sheets

(58) Field of Classification Search
CPC ...... B23K 1/0056; B23K 1/005; B23K 26/08; Y10T 29/49131
USPC .................................................. 29/833, 740
See application file for complete search history.

(56) References Cited

U.S. PATENT DOCUMENTS

| | | | |
|---|---|---|---|
| 8,760,665 B2* | 6/2014 | Ume | G01N 21/1702 356/502 |
| 2006/0108400 A1* | 5/2006 | Fukaya | H05K 3/3494 228/230 |
| 2007/0050158 A1 | 3/2007 | Fukunaka et al. | |

FOREIGN PATENT DOCUMENTS

| | | |
|---|---|---|
| JP | S61-263296 A | 11/1986 |
| JP | H03-124368 A | 5/1991 |
| JP | H08-18125 B2 | 2/1996 |
| JP | 2007-67165 A | 3/2007 |
| JP | 2008-173659 A | 7/2008 |
| JP | 2010-162583 A | 7/2010 |
| JP | 2015-131312 A | 7/2015 |

OTHER PUBLICATIONS

Translation of International Preliminary Report on Patentability (Form PCT/IPEA/409) issued in counterpart International Application No. PCT/JP2018/016599 dated Oct. 28, 2019. (5 pages).

* cited by examiner

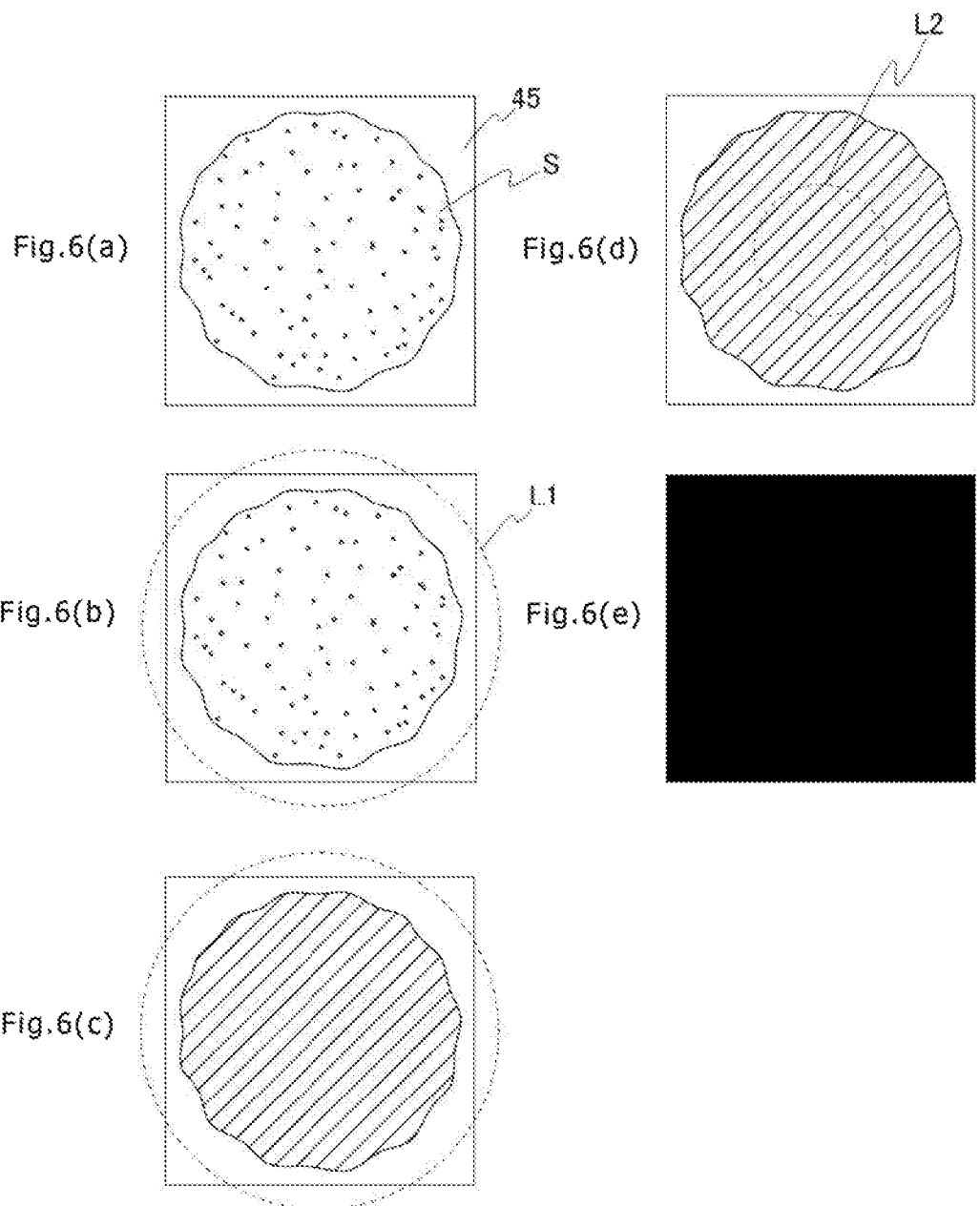

LASER SOLDERING METHOD AND DEVICE

TECHNICAL FIELD

The present invention relates to a laser soldering method and device adapted for automation of soldering work that is performed on a component mounted to the surface of a wiring board.

BACKGROUND ART

There has hitherto been known a laser soldering device and method in which soldering is performed by irradiating a soldering object with laser light in a spot-like shape. With such a laser soldering device and method, soldering to a fine portion can be performed in a contactless manner. On the other hand, because the laser soldering method entails abrupt heating and gives large local thermal stress to a printed board, it has a problem of causing burnout of a wiring board, producing solder balls, scattering residues to the surroundings outside a soldering region, or generating residues.

FIGS. 11(a) to 11(c) are explanatory plan views representing states of a solder droplet S and a soldering region (land area) 45 when the diameter of a laser irradiation region L3 is set to be smaller than that of the solder droplet S. FIGS. 11(d) to 11(f) are explanatory plan views representing states of the solder droplet S and the soldering region 45 when the diameter of a laser irradiation region L4 is set to be larger than the size of the soldering region 45.

In FIG. 11(a), the solder droplet S is formed on an electrode pad (land) that defines the soldering region 45. FIG. 11(b) represents a state in which the laser irradiation region L3 is adjusted to have the diameter sufficiently smaller than that of the solder droplet S. FIG. 11(c) represents a state after the laser light has been irradiated subsequent to the state of FIG. 11(b). In FIG. 11(c), residues 46 are generated around the soldering region 45.

In FIG. 11(d), the solder droplet S is formed on the electrode pad (land) that defines the soldering region 45. FIG. 11(e) represents a state in which the laser irradiation region L4 is adjusted to be sufficiently larger than the soldering region 45. FIG. 11(f) represents a state after the laser light has been irradiated subsequent to the state of FIG. 11(e). In FIG. 11(f), scorching 47 is generated around the soldering region 45.

Recently, in order to prevent the problems of bumping of a flux, burnout of the substrate, etc., which are caused by the abrupt heating, it has been proposed to perform preliminary heating until reaching a state in which a flux solvent component volatilizes while a solder powder remains not melted, and then to perform main heating up to a melting temperature of the solder powder. The preliminary heating is performed by using, for example, a heater in some cases and by irradiation with laser light in other cases.

For example, Patent Document 1 proposes a device including a preliminary heating laser in addition to a soldering laser, wherein soldering is performed by simultaneous irradiation with lights of the preliminary heating laser having a relatively large irradiation diameter and the soldering laser.

CITATION LIST

Patent Document

Patent Document 1: Japanese Patent Publication No. H8-18125

SUMMARY OF INVENTION

Technical Problem

A technique of applying a solder droplet onto the surface of an electrode pad (land) and heating the solder droplet by laser light has the problem of scorching a substrate or heat-susceptible components in the surroundings when not only a land area, but also a region outside the land area is irradiated with the laser light. On the other hand, when a region sufficiently smaller than the diameter of the solder droplet applied onto the land area is irradiated with the laser light, the problems may occur due to bumping of a flux, etc. in that residues are scattered to the region outside the land area (i.e., to the outside of the soldering region), that a solder is spattered to the surroundings while remaining in a non-melted state, and that solder balls are produced.

When soldering is automatically performed on a workpiece, such as a wiring board, by using a laser soldering device, the laser soldering device needs to be mounted to a robot head of an XYZ robot. If the weight of the robot head increases, the size of a drive device also needs to be increased. It is, therefore, preferable to reduce the weight of the laser soldering device that is mounted to the robot head. On the other hand, there is also a need for attaching a camera to the robot head and checking situations of the soldering.

An object of the present invention is to provide a laser soldering technique which can prevent generation of scorching of a substrate or heat-susceptible components in the surroundings, residues, etc. Another object of the present invention is to provide a laser soldering device with a structure suitable for weight reduction.

Solution to Problem

The present invention provides an automatic soldering method carried out using an automatic soldering device that includes a laser soldering device and a Z-axis drive device driving the laser soldering device in an up-down direction, wherein the laser soldering device comprises a body having a lower opening and an irradiation hole in communication with the lower opening, a laser device, an optical fiber guiding laser light from the laser device to enter the irradiation hole, and a mirror guiding the laser light to the lower opening by reflecting the laser light or allowing the laser light to pass therethrough, and wherein the automatic soldering method comprises a first height adjustment step of adjusting, by the Z-axis drive device, a height of the laser soldering device to a position at which the laser light has a preset irradiation diameter D1 larger than a diameter of a solder droplet S when viewed from above, a preliminary heating step of sending an irradiation command to the laser device, and irradiating solder droplet S with the laser light to heat the solder droplet S to a temperature at which a flux solvent component volatilizes and a solder powder does not melt, a second height adjustment step of adjusting, by the Z-axis drive device, the height of the laser soldering device to a position at which the laser light has a preset irradiation diameter D2 smaller than the diameter of solder droplet S when viewed from above, and a main heating step of sending an irradiation command to the laser device, irradiating solder droplet S with the laser light to heat the solder droplet S to a temperature at which the solder powder melts, and performing soldering.

In the automatic soldering method described above, the laser device may be constituted by a single laser device.

In the automatic soldering method described above, in the first height adjustment step, the irradiation diameter D1 may be set to fall within a range of 1.1 to 2 times the diameter of the solder droplet S.

In the automatic soldering method described above, in the second height adjustment step, the irradiation diameter D2 may be set to fall within a range of 0.1 to 0.9 times the diameter of the solder droplet S.

In the automatic soldering method described above, in the main heating step, the laser light may be applied at a higher output than in the preliminary heating step.

In the automatic soldering method described above, the body may have an image capturing hole, the laser soldering device may further comprise an image capturing device that captures an image of a workpiece through the image capturing hole and the mirror, and the image of the workpiece after the soldering may be captured in the main heating step.

In the automatic soldering method described above, plural patterns for relations among the diameter of the solder droplet S, combinations of the irradiation diameters D1 and D2 corresponding to the diameter of the solder droplet S, and the output of the laser light may be stored, and the first height adjustment step and the second height adjustment step may be performed in accordance with selected one of the patterns.

The present invention further provides an automatic soldering device including a laser soldering device, a Z-axis drive device driving the laser soldering device in an up-down direction, and a control device controlling operations of the laser soldering device and the Z-axis drive device, wherein the laser soldering device comprises a body having a lower opening and an irradiation hole in communication with the lower opening, a laser device, an optical fiber guiding laser light from the laser device to enter the irradiation hole, and a mirror guiding the laser light to the lower opening by reflecting the laser light or allowing the laser light to pass therethrough, and wherein the control device executes a first height adjustment step of adjusting, by the Z-axis drive device, a height of the laser soldering device to a position at which the laser light has a preset irradiation diameter D1 larger than a diameter of a solder droplet S when viewed from above, a preliminary heating step of sending an irradiation command to the laser device, and irradiating solder droplet S with the laser light to heat the solder droplet S to a temperature at which a flux solvent component volatilizes and a solder powder does not melt, a second height adjustment step of adjusting, by the Z-axis drive device, the height of the laser soldering device to a position at which the laser light has a preset irradiation diameter D2 smaller than the diameter of solder droplet S when viewed from above, and a main heating step of sending an irradiation command to the laser device, irradiating solder droplet S with the laser light to heat the solder droplet S to a temperature at which the solder powder melts, and performing soldering.

In the automatic soldering device described above, the laser device may be constituted by a single laser device.

In the automatic soldering device described above, in the first height adjustment step, the irradiation diameter D1 may be set to fall within a range of 1.1 to 2 times the diameter of the solder droplet S.

In the automatic soldering device described above, in the second height adjustment step, the irradiation diameter D2 may be set to fall within a range of 0.1 to 0.9 times the diameter of the solder droplet S.

In the automatic soldering device described above, in the main heating step, the laser light may be applied at a higher output than in the preliminary heating step.

In the automatic soldering device described above, the body may have an image capturing hole, and the laser soldering device may further comprise an image capturing device that captures an image of a workpiece through the image capturing hole and the mirror.

In the automatic soldering device described above, the image capturing hole may be a vertical hole, the laser light may be applied through the lower opening that may be a lower end opening of the image capturing hole, the irradiation hole may be a horizontal hole, and the mirror may be disposed at a point at which the image capturing hole and the irradiation hole intersect.

Advantageous Effects of Invention

According to the present invention, the laser soldering technique capable of preventing generation of scorching of a substrate or heat-susceptible components in the surroundings, residues, etc. can be provided.

The laser soldering device with the structure suitable for weight reduction can also be provided.

BRIEF DESCRIPTION OF THE DRAWINGS

FIG. 6(a) is a plan view illustrating a solder droplet S that is formed not to protrude from a soldering region prior to the start of automatic soldering, FIG. 6(b) is a plan view illustrating the solder droplet S and an irradiation region L1 in STEP 2, FIG. 6(c) is a plan view illustrating the solder droplet S in STEP 3, FIG. 6(d) is a plan view illustrating the solder droplet S and an irradiation region L2 in STEP 4, and FIG. 6(d) is a. plan view illustrating a soldering completed state after STEP 5.

FIG. 7(d) is a plan view illustrating a soldering completed state after STEP 5.

DESCRIPTION OF EMBODIMENTS

First Embodiment

<Structure>

Figure 1:
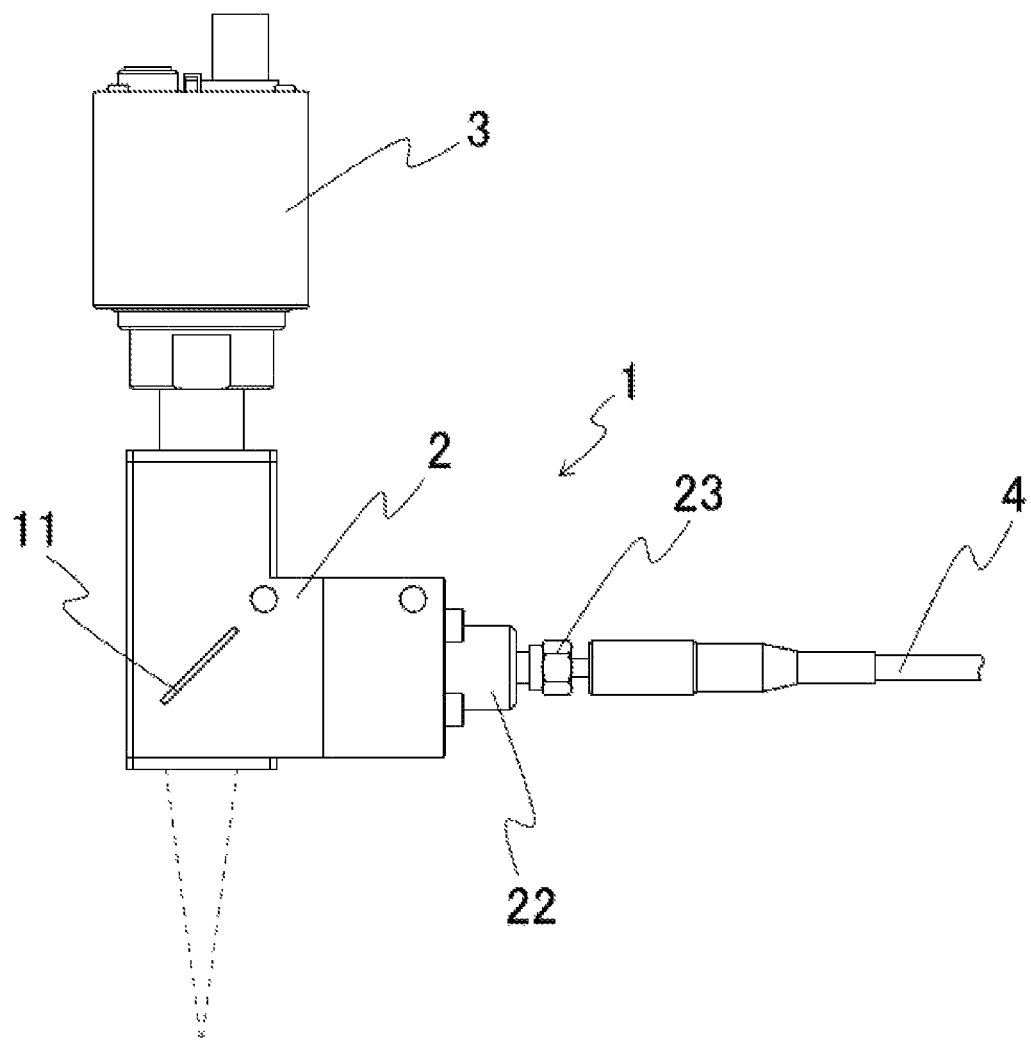
FIG. 1 is a from view of a laser soldering device according to a first embodiment

As illustrated in FIG. 1, a laser soldering device 1 according to a first embodiment includes a soldering device body 2, an image capturing device 3, and an optical cable 4.

The soldering device body 2 has an L-shape in a front view. An image capturing hole 5 being a cylindrical vertical hole and an irradiation hole 6 being a cylindrical horizontal hole are formed inside the soldering device body 2 (see FIG. 2). The optical cable 4 formed by covering optical fiber (i.e. an optical fiber core 21 and a cladding) is optically connected to a lateral end portion of the soldering device body 2.

The image capturing device 3 is mounted to an upper open end of the image capturing hole 5 and captures an image of a solder application region through a lower opening 7 of the image capturing hole 5. The image capturing device 3 is a color CCD camera, for example, and the center of an image captured by the image capturing device 3 is matched with an optical axis of laser light. In the first embodiment, because a condensing lens 14 can be moved up and down by a Z drive device 43 relative to a workpiece, a zoom lens for adjustment of a spot diameter is not necessary. In some cases, it is preferable to be in focus at the height in preliminary heating or main heating for the reason that focusing of the image capturing device 3 can be made without needing an operation of moving the condensing lens 14 up or down. An image-capturing position adjustment mechanism (not illustrated) capable of adjusting a physical position of the image capturing device 3 relative to the soldering device body 2 may be provided such that the image capturing device 3 can be in focus at the height in the preliminary heating or the main heating. The image-capturing position adjustment mechanism is constituted by, for example, a combination of a ball screw and an electric motor.

The image capturing device 3 may be the other type of device than the CCD camera insofar as the captured image can be processed with software. A magnifying lens and an illuminator may be additionally provided as required. In this embodiment, because the image capturing device 3 is disposed just above the condensing lens 14, an orientation of the workpiece is in match with that of the captured image (this point is advantageous, as in later-described second and third embodiments, in that the orientation of the captured image is not reversed).

In this embodiment, the image capturing device 3 includes no lenses, and an image capturing lens 12 and the condensing lens 14, described below, are disposed in the soldering device body 2. Here, a lens magnification is subordinately determined by "f-value of the image capturing lens 12/f-value of the condensing lens 14". From the viewpoint of weight and cost, a single-focus lens having a less number of lenses is preferably used. A high magnification lens having a comparatively high magnification and a shallow depth of field is preferably used in order to measure the position and the size of the workpiece with high accuracy.

A mirror 11, the image capturing lens 12, and the condensing lens 14 are disposed in the image capturing hole 5. The mirror 11 is disposed at a position at which the image capturing hole 5 and the irradiation hole 6 intersect perpendicularly, and is a half mirror reflecting laser light while allowing visible light to pass therethrough. The mirror 11 is arranged in a posture inclined 45 degrees relative to an optical axis of irradiation light from the optical fiber core 21 such that light from the condensing lens 14 passes through the mirror 11 toward the image capturing device 3 and the irradiation light from the optical fiber core 21 is reflected by the mirror 11 to enter the condensing lens 14.

The image capturing lens 12 is a lens for introducing the light having passed through the mirror 11 to the image capturing device 3. The condensing lens 14 is a flat-convex lens for condensing reflected light from a solder and a soldering region 45, and for applying, in a spot-like form, the laser light from the optical fiber core 21 to an electrode pad (land).

Figure 2:
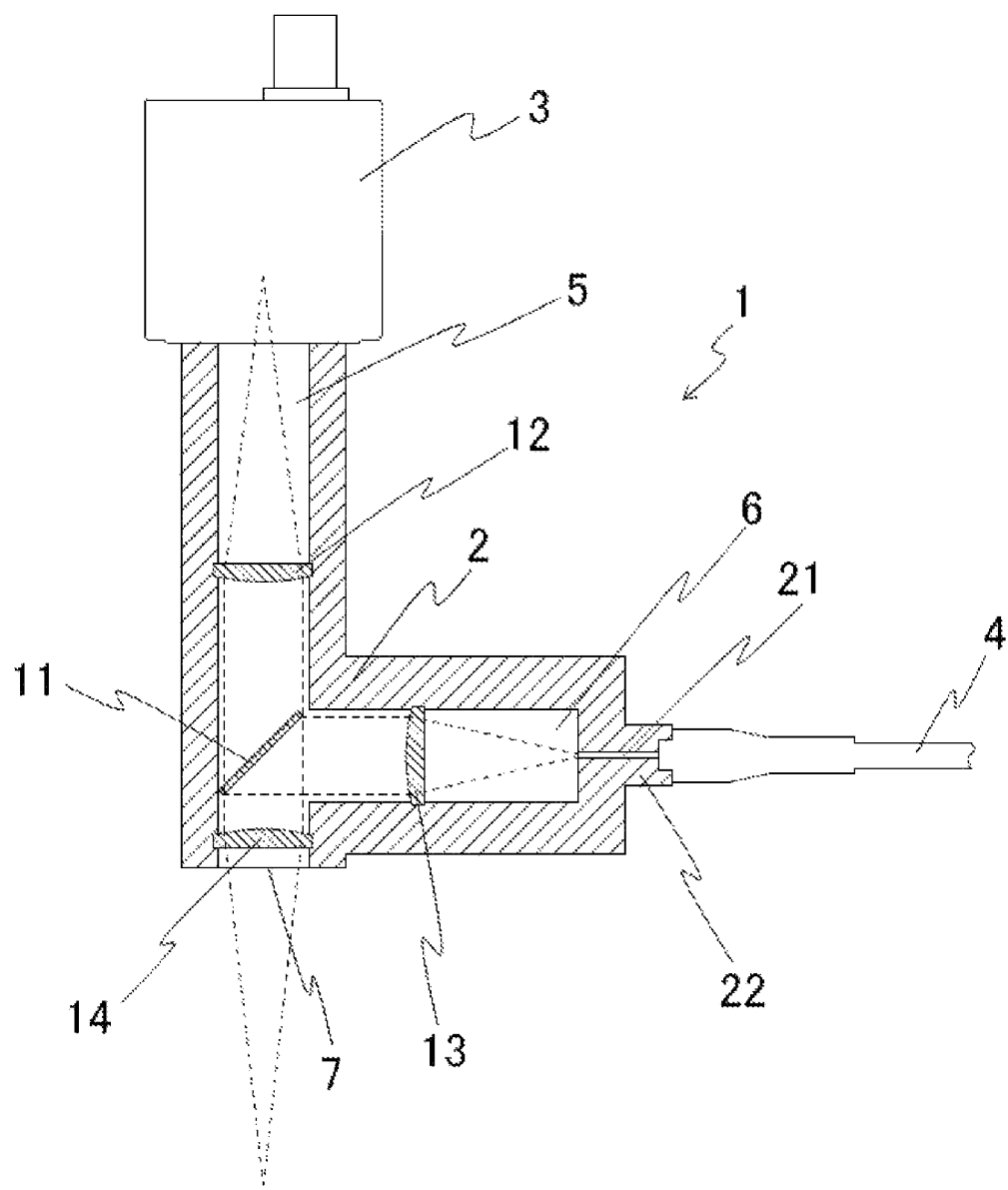
FIG. 2 is a front sectional view of the laser soldering device according to the first embodiment.

A fiber lens 13 is disposed in the irradiation hole 6. The fiber lens 13 is a collimating lens for converting light emitted from an end of the optical fiber core 21 to parallel light, and for causing the parallel light to enter the mirror 11. An end of the optical fiber core 21 is inserted into a through-hole the through-hole being much thinner than the irradiation hole 6 and formed at an end of the irradiation hole 6 on the opposite side to the mirror 11. A coupling portion 22 is provided on the side away from the mirror 11 with respect to the optical fiber core 21 extending horizontally. A nut 23 coupled to a ferrule provided at a terminal end of the optical cable 4 is coupled to the coupling portion 22. In FIG. 2, the coupling portion 22 and the nut 23 are drawn in a simplified fashion.

The optical cable 4 is connected to a laser device (not illustrated) and transfers laser light emitted from the laser device therethrough. For example, the laser device emits the laser light with several hundreds of mW to 30 W (or several hundreds of mW to 20 W) for several seconds in the preliminary heating and emits the laser light with several W to several tens of W for several seconds in the main heating. How much emission output of the laser light is to be set depends on the type of the workpiece and a solder application diameter.

Figure 3:
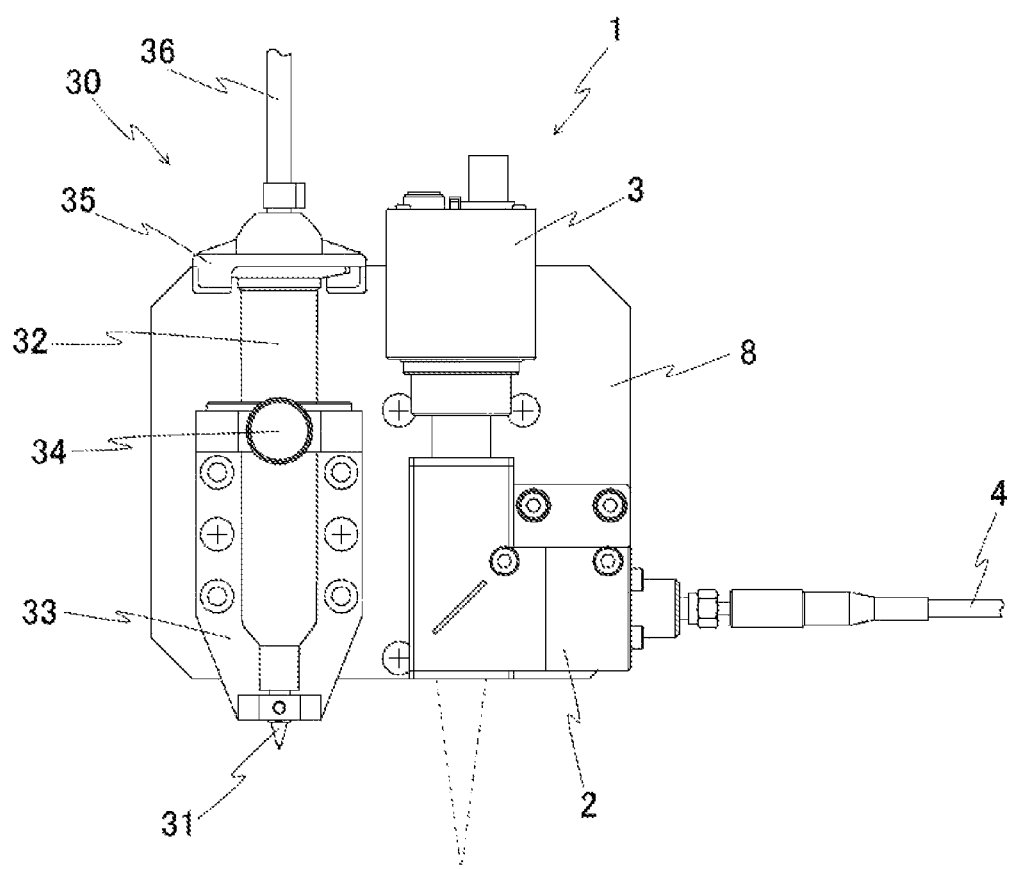
FIG. 3 is a front view of the laser soldering device and a discharge device both attached to an attachment member.

The laser soldering device 1 is mounted to an attachment member 8 coupled to the Z drive device 43. As illustrated in FIG. 3, the attachment member 8 is constituted by a plate-like member having a substantially rectangular shape, and the laser soldering device 1 and a discharge device 30 are disposed on the same plane. Because the attachment member 8 holds the laser soldering device 1 and the discharge device 30 together, the laser soldering device 1 and the discharge device 30 can be moved at the same time by XZ drive devices (41, 43). Although separate drive devices are not required for each of the laser soldering device 1 and the discharge device 30 by using the attachment member 8, a total weight of the devices mounted to the attachment member 8 increases and a load applied to each of the XZ drive devices increases. It is, therefore, preferable to reduce the weight of each of the laser soldering device 1 and the discharge device 30 that are mounted to the attachment member 8.

The discharge device 30 includes a nozzle 31, a storage container 32, a container holder 33, a fixing member 34, an adapter 35, and a tube 36.

The nozzle 31 is a universal nozzle detachably coupled to a lower opening of the storage container 32 and is replaceable with another one having a different nozzle diameter.

The storage container 32 is constituted by a universal syringe and is inserted into the container holder 33 to be held there. A paste-like solder (creamy solder) is filled in the storage container 32. The paste-like solder is a mixture of a solder powder and a liquid-phase or paste-like flux (having high viscosity). The viscosity of the paste-like flux is adjusted to, for example, several ten thousands to several hundred thousands of mPa·s by using a solvent. The solder powder is given as, for example, an alloy containing tin (Sn) as a base material and one or two or more among lead (Pb), silver (Ag), copper (Cu), zinc (Zn), nickel (Ni), antimony (Sb), indium (In), and bismuth (Bi) as an additive or additives.

The fixing member 34 is a screw member that is inserted into a thread groove formed in the container holder 33, and that has a contact portion at a tip end. The storage container 32 can be fixedly held by rotating the fixing member 34 forward and pressing contact portion against the storage container 32, or can be released from the fixed state by rotating the fixing member 34 backward.

The adapter 35 is detachably attached to an upper opening of the storage container 32. The adapter 35 is coupled to the tube 36, and pressurized air from an air supply source (not illustrated) is supplied to an upper space in the storage container 32 through the tube 36.

The discharge device 30 is not limited to an air dispenser illustrated here, and any desired type of discharge device (dispenser), such as the jet, plunger, or screw type, may also be used. Although there are two types of jet discharge devices, i.e., the seated type of causing a needle tip to be contacted with a valve seat when forming one liquid droplet, and the non-seated type of not causing the needle tip to be contacted with the valve seat when forming one liquid droplet, the present invention can be applied to both of those types.

Figure 4:
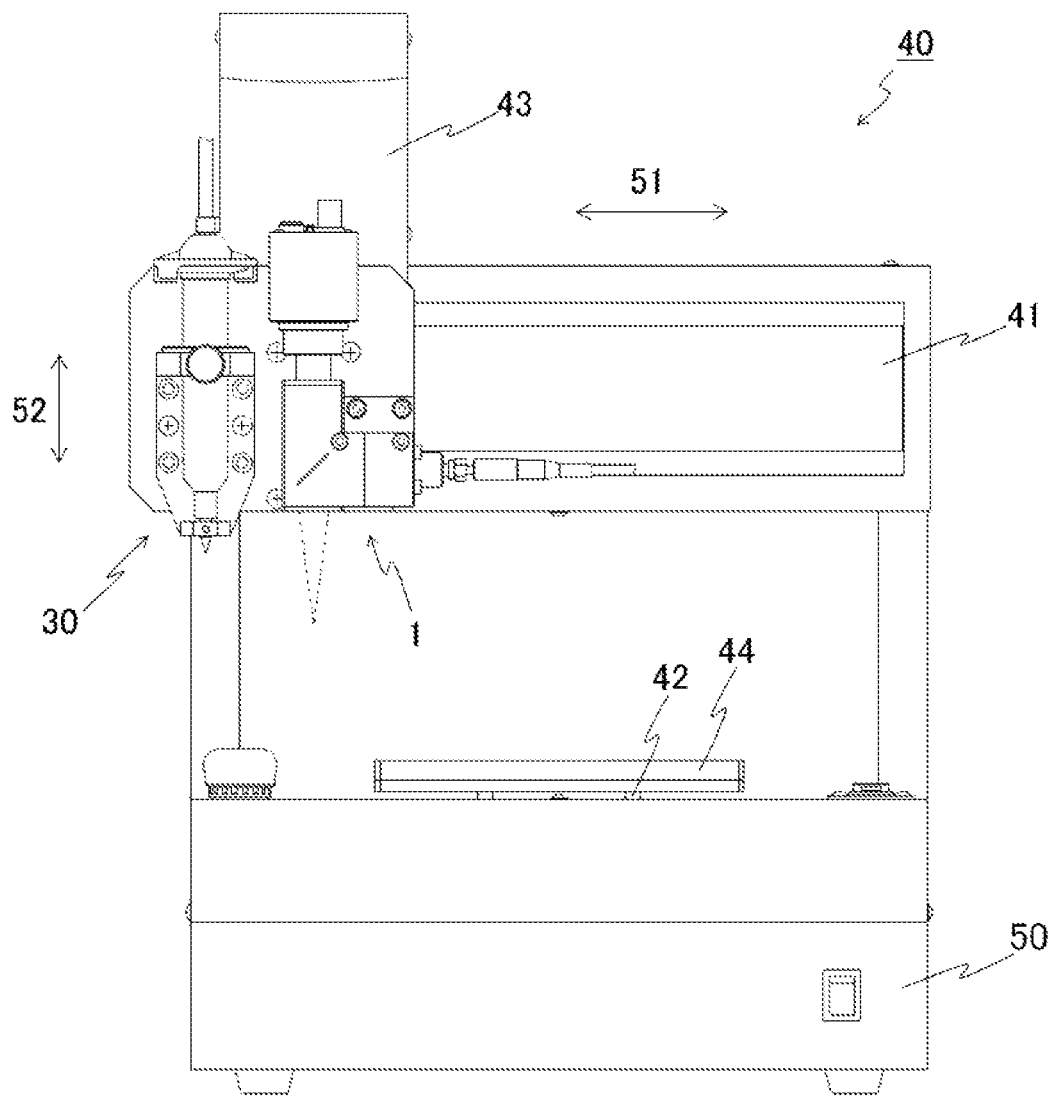
FIG. 4 is a front view of an automatic soldering device according to the first embodiment.
Figure 5:
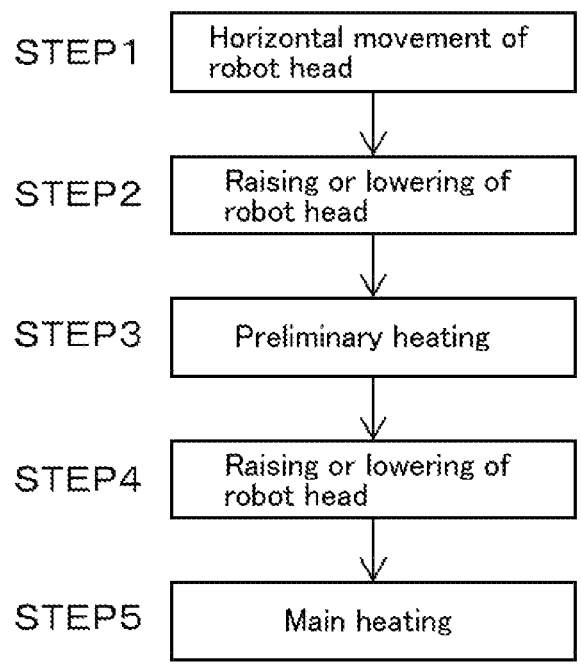
FIG. 5 is a flowchart illustrating processing procedures of an automatic soldering method according to the first embodiment.
Figure 7A:
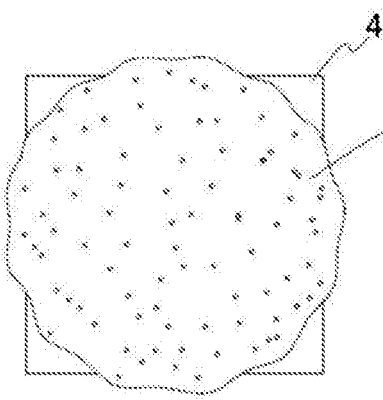
FIG. 7(a) is a plan view illustrating a solder droplet S that is formed to protrude from the soldering region prior to the start of automatic soldering.
Figure 7D:
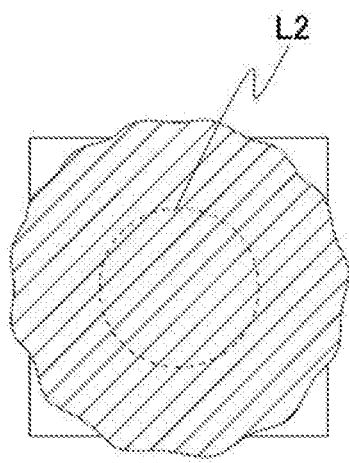
FIG. 7(d) is a plan view illustrating the solder droplet S and the irradiation region L2 in STEP 4.
Figure 7B:
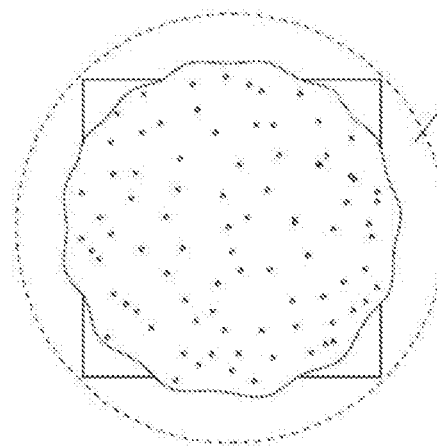
FIG. 7(b) is a plan view illustrating the solder droplet S and the irradiation region L1 in STEP 2.
Figure 7E:
FIG. 7(c) is a plan view illustrating the solder droplet S in STEP 3.
Figure 7C:
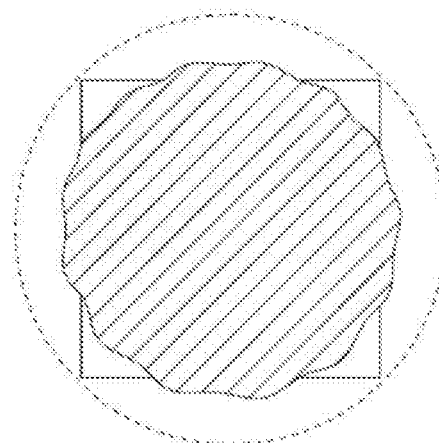
Figures 8A, 8B:
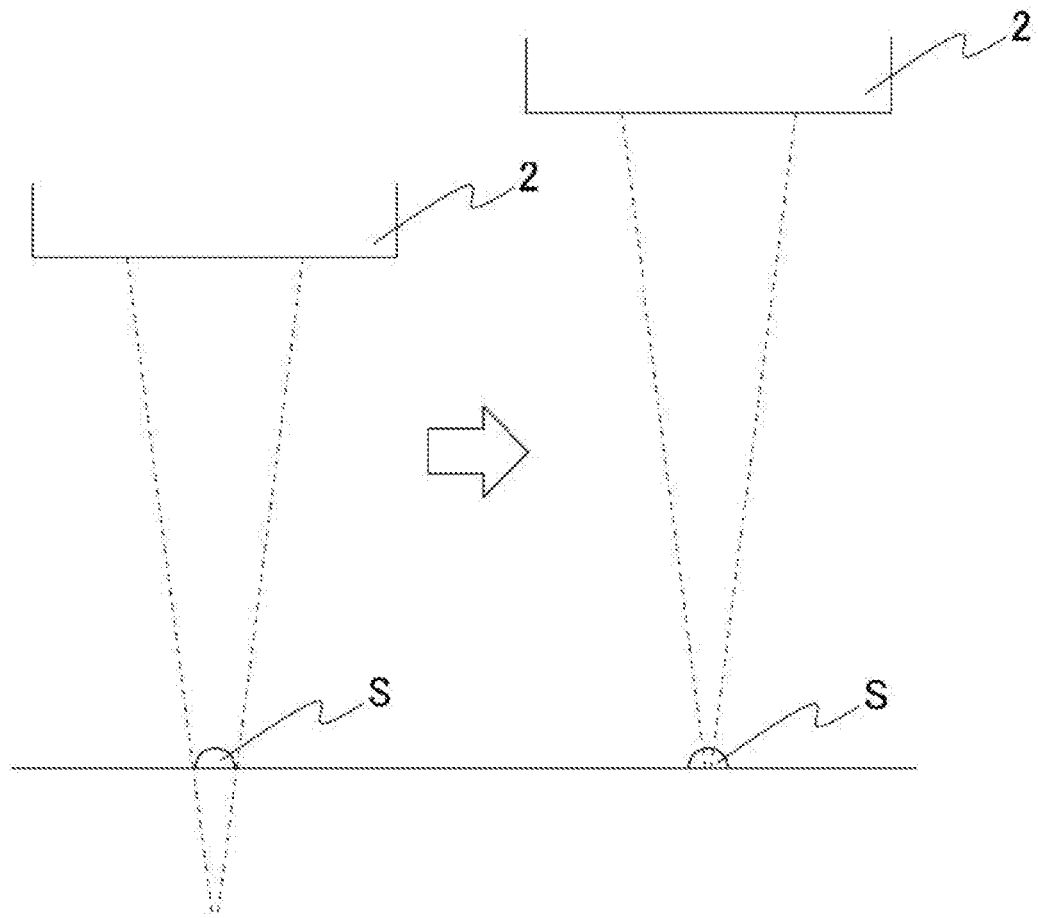
FIG. 8(a) is a side view illustrating the solder droplet S and the laser soldering device in STEP 2.
FIG. 8(b) is a side view illustrating the solder droplet S and the laser soldering device in STEP 4.

An automatic soldering device 40 illustrated in FIG. 4 is mainly constituted by the laser soldering device 1, the discharge device 30, an X drive device 41, the Y drive device 42, the Z drive device 43, a stage 44, an automatic soldering device body 50, and a control device (not illustrated) controlling operations of the drive devices (41, 42, 43).

The stage 44 is a plate-like member coupled to the Y drive device 42, and a workpiece (e.g., a substrate having a surface in which a wiring pattern is formed, and to which a semiconductor element is mounted) is placed on the stage 44. An alignment mark is put on the workpiece in the first embodiment, and focus adjustment and alignment of the image capturing device 3 are performed with the alignment mark being a reference. A corner of a semiconductor chip may be used as the alignment mark.

The laser soldering device 1 and the discharge device 30 are mounted to the Z drive device 43 with the attachment member 8 interposed therebetween and are movable in an up-down direction (i.e., a Z-direction) 52. A robot head including the Z drive device 43 is mounted to the X drive device 41 and is movable in a left-right direction (i.e., an X-direction) 51. Thus, the laser soldering device 1 and the discharge device 30 are relatively movable in the XYZ-directions with respect to the stage 44 coupled to the Y drive device 42.

The drive devices (41, 42, 43) can be each continuously positioned at short distance intervals (e.g., accuracy with an interval of 0.1 mm or less), and are each constituted by using, for example, a combination of a ball screw and an electric motor, or a linear motor.

The control device (not illustrated) is a computer including an arithmetic device, a storage device, a display device, and an input device, and is connected to the automatic soldering device 40 through a connection cable (not illustrated). The control device stores, in the storage device, solder application coordinates (=center coordinates of the soldering region 45=center coordinates of a solder droplet S), a diameter of the solder droplet S corresponding to the solder application coordinates, laser irradiation diameters D1 and D2 corresponding to the diameter of the solder droplet S, and an output of the laser light.

The irradiation diameter D1 is always larger than the diameter of the solder droplet S before the preliminary heating and is set to fall within a range of, for example, 1.1 to 2 times the diameter of the solder droplet S. Although a laser power density is low and a risk of scorching of components and a substrate is small in the preliminary heating, the irradiation diameter D1 may be set to a size such that the laser light does not protrude from the electrode pad (land), i.e., the soldering region 45.

The irradiation diameter D2 is set to fall within a range of, for example, 0.1 to 0.9 times the diameter of the solder droplet S before the preliminary heating.

The diameter of the solder droplet S before the preliminary heating is a size such that the solder droplet S does not protrude from the soldering region 45 in some cases as illustrated in FIG. 6, and is a size such that the solder droplet S protrudes from the soldering region 45 (namely, larger than a short side length of the soldering region 45) in other cases as illustrated in FIG. 7. The irradiation diameter D2 is set to a size such that the laser light does not protrude from the soldering region 45 and is, for example, 50 to 95% of the short side length or diameter of the electrode pad (land), i.e., the soldering region 45.

The laser irradiation diameters D1 and D2 corresponding to the diameter of the solder droplet S are determined by a preliminary experiment. When the diameter of the solder droplet S to be formed is different for each soldering region 45, the corresponding laser irradiation diameters D1 and D2 are also different. Preferably, a threshold is set for a change range of the diameter of the solder droplet S, and the laser irradiation diameters D1 and D2 are changed when the diameter of the solder droplet S is changed beyond the threshold. For example, even when many solder droplets S having different diameters are formed on one wiring board, the laser irradiation diameters D1 and D2 need not to be changed if the diameter is changed within the threshold.

Preferably, plural patterns for relations among the laser irradiation diameters D1 and D2 corresponding to the diameter of the solder droplet S and the output of the laser light are previously prepared and stored in the storage device, and solder application work is performed in accordance with one of the patterns selected depending on the solder application work.

The automatic soldering device body 50 is constituted by a desktop stand, and the Y drive device 42, etc. are incorporated in the automatic soldering device body 50.

Although this embodiment discloses the case including the X drive device 41, the Y drive device 42, and the Z drive device 43, the automatic soldering device for implementing the automatic soldering method according to the present invention is just required to include at least the Z drive device 43. For example, the automatic soldering method according to the present invention can also be implemented by combining a known conveyor device carrying the workpiece with an automatic soldering device including only the Z drive device 43.

<Operation>

A soldering operation using the automatic soldering device 40 will be described below with reference to FIGS. 5 to 8. The electrode pad (land), i.e., the soldering region 45, is in a state in which the solder droplet S is formed thereon (see FIGS. 6(*a*) and 7(*a*)).

STEP 1: The control device drives the X drive device 41 and the Y drive device 42 to perform horizontal positioning of the robot head (Z drive device) 43 such that the center of the solder droplet S is positioned just under the center of the lower opening 7.

STEP 2: The control device raises or lowers the robot head (Z drive device) 43 and performs height adjustment to such a position that an irradiation region L1 of the laser light has a preset size larger than the diameter of the solder droplet S when viewed from above (first height adjustment step: see FIGS. 6(*b*) and 7(*b*)). The diameter of the solder droplet S and the height coordinate of the robot head (Z drive device) 43 to obtain the irradiation region L1 (=irradiation diameter D1) are previously input to the control device.

STEP 3: The control device sends an irradiation command to the laser device and performs the preliminary heating by irradiating the solder droplet S with the laser light through the lower opening 7 for several seconds. With the preliminary heating, the solder droplet S is heated to temperature (e.g., 100 to 170° C.) at which a solvent component of the flux contained in the solder droplet S volatilizes and the solder powder does not melt. Thus, at least part of the volatile component evaporates, and the solder droplet S comes into a semi-solid state (see FIGS. 6(*c*) and 7(*c*)). During the preliminary heating, the irradiation output of the laser light is usually held constant, but it may be changed in some cases.

STEP 4: The control device raises or lowers the robot head (Z drive device) 43 and performs height adjustment to such a position that an irradiation region L2 of the laser light has a preset size smaller than the diameter of the solder droplet S when viewed from above (second height adjustment step: see FIGS. 6(*d*), 7(*d*), and FIG. 8(*b*)). The height coordinate of the robot head (Z drive device) 43 to obtain the irradiation region L2 (=irradiation diameter D2) is previously input to the control device.

STEP 5: The control device sends an irradiation command to the laser device and performs the main heating by irradiating the solder droplet S with the laser light at a higher output than that in the preliminary heating through the lower opening 7 for several seconds. With the main heating, the solder powder is melted and the soldering work on the solder application region is completed (see FIGS. 6(*e*) and 7(*e*)). Upon the stop of the irradiation with the laser light, the melted solder solidifies rapidly. During the main heating, the irradiation output of the laser light may be changed. For example, the irradiation may be performed in a manner of initially applying the laser light with several W for 0.1 to 2 sec, then gradually increasing the output to several tens of W for 1 to 4 sec, and then stopping the output (i.e., irradiation for 2 to 6 sec in total).

In the above STEP 2 and 4, the sizes of the irradiation regions L1 and L2 of the laser light (i.e., the distance between the focal point and the condensing lens 14) may be adjusted to adjust a volatilizing level of the flux solvent component and a melting level of the solder powder. Although adjustment of the intensity of the laser light is basically not required, the intensity of the laser light used for the irradiation in STEP 5 may be adjusted to increase in some cases.

In each of the above STEPS, an image representing the state of the solder droplet S may be captured by the image capturing device 3 and displayed on the display device. When the image capturing device 3 does not include the zoom function, it may be adjusted to be in focus at the completion of the height adjustment in STEP 2 or STEP 4. In particular, by adjusting the image capturing device 3 to be in focus in STEP 4, it is possible to capture an image representing the state after the completion of the soldering work (i.e., after the end of STEP 5), and to determine whether the soldering work has been successfully finished or not. A position adjustment mechanism for adjusting a vertical position of the lens 12 may be disposed.

The above-described laser soldering device 1 according to the first embodiment can be provided as a laser soldering device in which generation of scorching of a substrate or heat-susceptible components in the surroundings, residues, etc. can be prevented by performing the preliminary heating and the main heating. Furthermore, since only one laser device (light source) is used and the number of optical components is minimized, the weight of the laser soldering device can be reduced.

Second Embodiment

Figure 9:
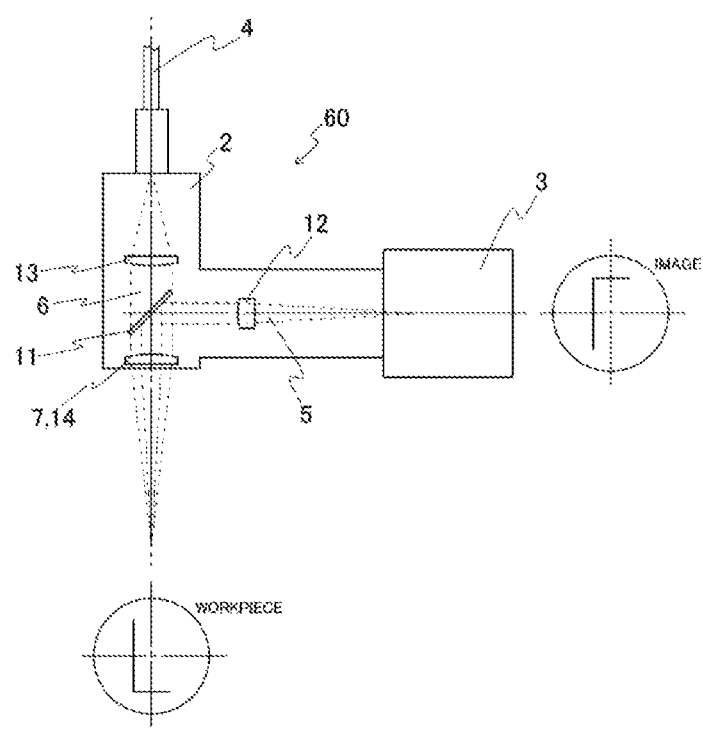
FIG. 9 is a front sectional view of a laser soldering device according to a second embodiment.

FIG. 9 is a front sectional view of a laser soldering device 60 according to a second embodiment. The second embodiment is different from the first embodiment mainly in that an image capturing device 3 is disposed laterally of a soldering device body 2 and an optical cable 4 is disposed above the soldering device body 2.

The soldering device body 2 has an L-shape in a front view. An image capturing hole 5 being a cylindrical horizontal hole and an irradiation hole 6 being a cylindrical vertical hole are formed inside the soldering device body 2. A condensing lens 14 is attached to a lower opening 7 formed at an end of the irradiation hole 6. The image capturing device 3 and the optical cable 4 are similar to those in the first embodiment.

A mirror 11 is a half mirror, and laser light emitted from an end of the optical cable 4 is applied to the electrode pad (land) after passing through the mirror 11. Visible light entering the condensing lens 14 is reflected by the mirror 11 and enters the image capturing device 3. The image capturing lens 12, the fiber lens 13, and the condensing lens 14 are the same as those in the first embodiment.

The above-described laser soldering device 60 according to the second embodiment can be provided as a laser soldering device in which generation of scorching of a substrate or heat-susceptible components in the surroundings, residues, etc. can be prevented by performing the preliminary heating and the main heating. Furthermore, since only one laser device (light source) is used and the number of optical components is minimized, the weight of the laser soldering device can be reduced.

In the second embodiment, because an orientation of an image captured by the image capturing device 3 is reversed to that of a workpiece, it is required to execute image processing with software, or to dispose a mirror for reversing the captured image (in this respect, the first embodiment is more advantageous).

Third Embodiment

Figure 10:
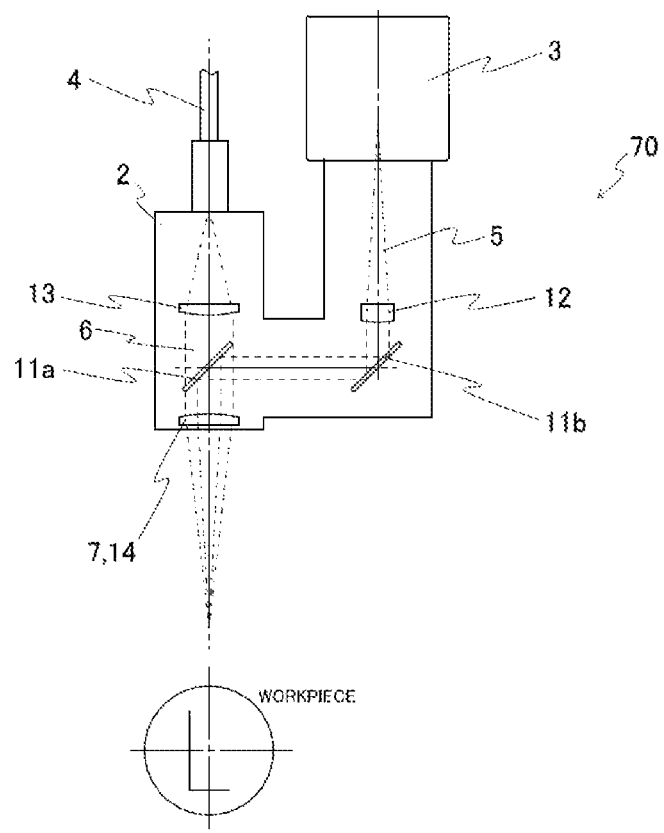
FIG. 10 is a front sectional view of a laser soldering device according to a third embodiment.
Figure 11A:
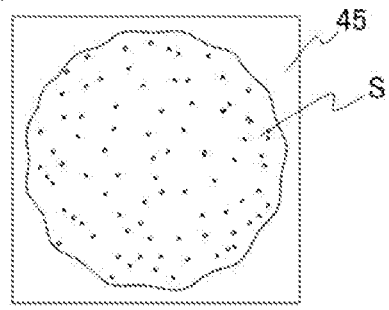
FIG. 11(a) is a plan view illustrating a solder droplet S prior to the start of automatic soldering according to the related art.
Figure 11D:
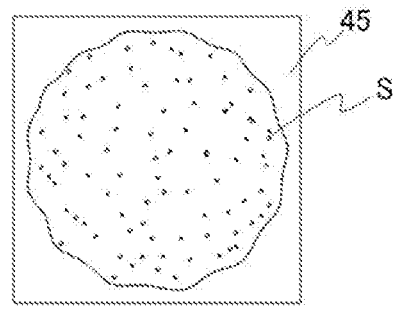
FIG. 11(d) is a plan view illustrating a solder droplet S prior to the start of automatic soldering according to the related art.
Figure 11B:
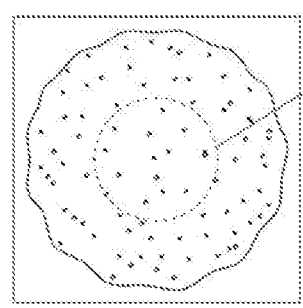
FIG. 11(b) is a plan view illustrating the solder droplet S and an irradiation region L3 immediately before laser irradiation.
Figure 11E:
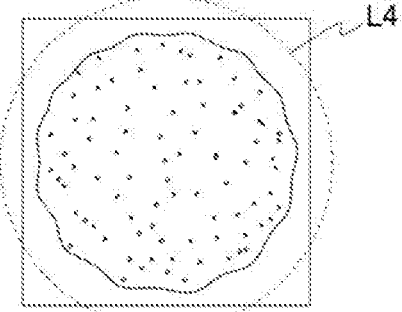
FIG. 11(e) is a plan view illustrating the solder droplet S and an irradiation region L4 immediately before laser irradiation.
Figure 11C:
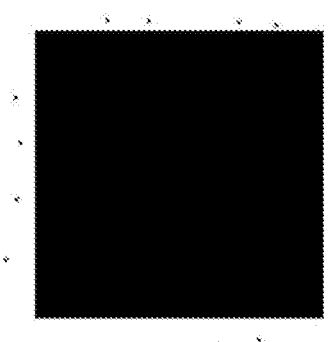
FIG. 11(c) is a plan view illustrating the solder droplet S after the completion of the automatic soldering.
Figure 11F:
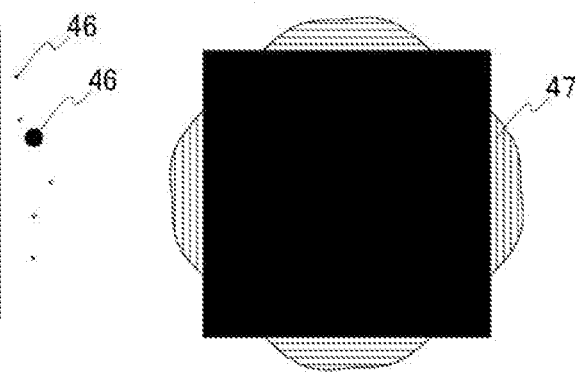
FIG. 11(f) is a plan view illustrating the solder droplet S after the completion of the automatic soldering.

FIG. 10 is a front sectional view of a laser soldering device 70 according to a third embodiment. The third embodiment is different from the first embodiment mainly in that an image capturing device 3 and an optical cable 4 are disposed above a soldering device body 2.

The soldering device body 2 has a substantially U-shape in a front view, and it includes a first pipe in which an image capturing hole 5 being a cylindrical vertical hole is formed and a second pipe in which an irradiation hole 6 being a cylindrical vertical hole is formed. A condensing lens 14 is attached to a lower opening 7 formed at an end of the irradiation hole 6. The image capturing device 3 and the optical cable 4 are similar to those in the first embodiment.

A mirror 11a is a half mirror, and laser light emitted from the end of the optical cable 4 is applied to the electrode pad (land) after passing through the mirror 11a. Visible light entering the condensing lens 14 is reflected by the mirror 11a and enters a mirror 11b. The visible light is further reflected by the mirror 11b and enters the image capturing device 3. The mirror 11b can be constituted by a general mirror. The image capturing lens 12, the fiber lens 13, and the condensing lens 14 are the same as those in the first embodiment.

The above-described laser soldering device 70 according to the third embodiment can be provided as a laser soldering device in which generation of scorching of a substrate or heat-susceptible components in the surroundings, residues, etc. can be prevented by performing the preliminary heating and the main heating.

In the third embodiment, although the captured image is not reversed because of using the two mirrors, the number of optical components increases and the size of the soldering device body 2 increases. From the viewpoint of weight reduction, therefore, the first embodiment is more advantageous.

While the preferred embodiments of the present invention have been described above, the technical scope of the present invention is not limited to the above embodiments. The above embodiments can be variously modified and improved, and the modified and improved embodiments also fall within the technical scope of the present invention.

LIST OF REFERENCE SIGNS 1 laser soldering device (first embodiment)
2 soldering device body
3 image capturing device
4 optical cable
5 image capturing hole
6 irradiation hole
7 lower opening
8 attachment member
11 mirror
12 image capturing lens
13 fiber lens
14 condensing lens
21 optical fiber core
22 coupling portion
23 nut
30 discharge device
31 nozzle
32 storage container
33 container holder
34 fixing member
35 adapter
36 tube
40 automatic soldering device
41 X drive device
42 Y drive device
43 Z drive device (robot head)
44 stage
45 soldering region (land area)
46 residue
47 scorching
50 automatic soldering device body
51 X-direction
52 Z-direction
60 laser soldering device (second embodiment)
70 laser soldering device (third embodiment)
S solder droplet
D1, D2 laser irradiation diameter
L1, L1 laser irradiation region

The invention claimed is:

1. An automatic soldering method carried out using an automatic soldering device that includes a laser soldering device and a Z-axis drive device driving the laser soldering device in an up-down direction,
   wherein the laser soldering device comprises:
     a body having a lower opening, an image capturing hole in communication with the lower opening, and an irradiation hole in communication with the lower opening;
     a mirror guiding the laser light to the lower opening by reflecting the laser light or allowing the laser light to pass therethrough, and guiding light having entered the lower opening by reflecting the light or allowing the light to pass therethrough,
     an image capturing device capturing an image of a workpiece through the image capturing hole and the mirror;
     a laser device constituted by a single laser light source; and
     an optical fiber guiding laser light from the laser device to enter the irradiation hole; and
   wherein the automatic soldering method comprises:
     a first height adjustment step of adjusting, by the Z-axis drive device, a height of the laser soldering device to a position at which the laser light has a preset irradiation diameter D1 larger than a diameter of a solder droplet S when viewed from above;
     a preliminary heating step of sending an irradiation command to the laser device, and irradiating the solder droplet S with the laser light to heat the solder droplet S to a temperature at which a flux solvent component volatilizes and a solder powder does not melt;
     a second height adjustment step of adjusting, by the Z-axis drive device, the height of the laser soldering device to a position at which the laser light has a preset irradiation diameter D2 smaller than the diameter of the solder droplet S when viewed from above; and
     a main heating step of sending an irradiation command to the laser device, the irradiation command causing the laser device to emit the laser light with a higher output than in the preliminary heating step, irradiating the solder droplet S with the laser light to heat the solder droplet S to a temperature at which the solder powder melts, and performing soldering.

2. The automatic soldering method according to claim 1, wherein, in the second height adjustment step, the height of the laser soldering device is adjusted such that the laser light applied in the main heating step does not protrude from a region of an electrode pad.

3. The automatic soldering method according to claim 2, wherein the solder droplet S is formed to protrude from the region of the electrode pad.

4. The automatic soldering method according to claim 1, wherein, in the first height adjustment step, the irradiation diameter D1 is set to fall within a range of 1.1 to 2 times the diameter of the solder droplet S.

5. The automatic soldering method according to claim 4, wherein, in the second height adjustment step, the irradiation diameter D2 is set to fall within a range of 0.1 to 0.9 times the diameter of the solder droplet S.

6. The automatic soldering method according to claim 1, wherein the main heating step includes a step of gradually increasing the output of the laser light.

7. The automatic soldering method according to claim 6, wherein, in the main heating step, the laser light is applied at a certain output for a preset time, and thereafter the output of the laser light is gradually increased.

8. The automatic soldering method according to claim 1, wherein plural patterns for relations among the diameter of the solder droplet S, combinations of the irradiation diameters D1 and D2 corresponding to the diameter of the solder droplet S, and the output of the laser light are stored, and the first height adjustment step and the second height adjustment step are performed in accordance with selected one of the patterns.

9. The automatic soldering method according to claim 1, wherein the image capturing device is constituted to be in focus in the second height adjustment step.

10. An automatic soldering device including a laser soldering device, a Z-axis drive device driving the laser soldering device in an up-down direction, and a control device controlling operations of the laser soldering device and the Z-axis drive device,
wherein the laser soldering device comprises:
a body having a lower opening, an image capturing hole in communication with the lower opening, and an irradiation hole in communication with the lower opening;
a mirror guiding the laser light to the lower opening by reflecting the laser light or allowing the laser light to pass therethrough, and guiding light having entered the lower opening by reflecting the light or allowing the light to pass therethrough,
an image capturing device capturing an image of a workpiece through the image capturing hole and the mirror;
a laser device constituted by a single laser light source; and
an optical fiber guiding laser light from the laser device to enter the irradiation hole; and
wherein the control device executes:
a first height adjustment step of adjusting, by the Z-axis drive device, a height of the laser soldering device to a position at which the laser light has a preset irradiation diameter D1 larger than a diameter of a solder droplet S when viewed from above;
a preliminary heating step of sending an irradiation command to the laser device, and irradiating the solder droplet S with the laser light to heat the solder droplet S to a temperature at which a flux solvent component volatilizes and a solder powder does not melt;
a second height adjustment step of adjusting, by the Z-axis drive device, the height of the laser soldering device to a position at which the laser light has a preset irradiation diameter D2 smaller than the diameter of the solder droplet S when viewed from above; and a main heating step of sending an irradiation command to the laser device, the irradiation command causing the laser device to emit the laser light with a higher output than in the preliminary heating step, irradiating the solder droplet S with the laser light to heat the solder droplet S to a temperature at which the solder powder melts, and performing soldering.

11. The automatic soldering device according to claim 10, wherein, in the second height adjustment step, the height of the laser soldering device is adjusted such that the laser light applied in the main heating step does not protrude from a region of an electrode pad.

12. The automatic soldering device according to claim 10, wherein, in the first height adjustment step, the irradiation diameter D1 can be set to fall within a range of 1.1 to 2 times the diameter of the solder droplet S.

13. The automatic soldering device according to claim 12, wherein, in the second height adjustment step, the irradiation diameter D2 can be set to fall within a range of 0.1 to 0.9 times the diameter of the solder droplet S.

14. The automatic soldering device according to claim 10, wherein the main heating step includes a step of gradually increasing the output of the laser light.

15. The automatic soldering device according to claim 14, wherein, in the main heating step, the laser light is applied at a certain output for a preset time, and thereafter the output of the laser light is gradually increased.

16. The automatic soldering device according to claim 10, wherein the image capturing hole is a vertical hole, and the laser light is applied through the lower opening that is a lower end opening of the image capturing hole, and
wherein the irradiation hole is a horizontal hole, and the mirror is disposed at a point at which the image capturing hole and the irradiation hole intersect.

17. The automatic soldering device according to claim 10, wherein an optical fiber lens is disposed between the mirror and the irradiation hole, and an image capturing lens is disposed between the mirror and the image capturing hole.

18. The automatic soldering device according to claim 17, wherein the image capturing lens is a single-focus lens, and the automatic soldering device further comprises a position adjustment mechanism capable of adjusting a physical position of the image capturing device relative to the body, or wherein the optical fiber lens is a single-focus lens and the automatic soldering device further comprises a position adjustment mechanism capable of adjusting a position of the image capturing lens.

19. The automatic soldering device according to claim 10, wherein the image capturing device is constituted to be in focus in the second height adjustment step.

20. The automatic soldering device according to claim 10, further comprising:
a discharge device; and
an attachment member holding the laser soldering device and the discharge device and coupled to the Z-axis drive device.

21. The automatic soldering device according to claim 20, further comprising an X-axis drive device to which the Z-axis drive device is mounted,
wherein the laser soldering device and the discharge device are simultaneously moved by the Z-axis drive device and the X-axis drive device.

* * * * *